(12) United States Patent
Fukazawa

(10) Patent No.: US 7,361,532 B2
(45) Date of Patent: Apr. 22, 2008

(54) METHOD OF MANUFACTURING SEMICONDUCTOR DEVICE

(75) Inventor: Motohiko Fukazawa, Suwa (JP)

(73) Assignee: Seiko Epson Corporation (JP)

( * ) Notice: Subject to any disclaimer, the term of this patent is extended or adjusted under 35 U.S.C. 154(b) by 211 days.

(21) Appl. No.: 11/313,031

(22) Filed: Dec. 20, 2005

(65) Prior Publication Data

US 2006/0138629 A1 Jun. 29, 2006

(30) Foreign Application Priority Data

Dec. 24, 2004 (JP) .............................. 2004-372795

(51) Int. Cl.
*H01L 21/50* (2006.01)
*H01L 21/30* (2006.01)
*H01L 21/78* (2006.01)

(52) U.S. Cl. ...................... 438/113; 459/462; 459/464; 257/E21.499

(58) Field of Classification Search ........ 257/E23.001, 257/E21.499, E21.508
See application file for complete search history.

(56) References Cited

U.S. PATENT DOCUMENTS

| 5,071,792 | A | * | 12/1991 | VanVonno et al. | ............. | 438/17 |
| 6,828,175 | B2 | * | 12/2004 | Wood et al. | ................. | 438/113 |
| 7,052,975 | B2 | | 5/2006 | Koizumi | | |
| 2004/0043603 | A1 | * | 3/2004 | Wood et al. | ................. | 438/637 |
| 2004/0245623 | A1 | | 12/2004 | Hara et al. | | |
| 2004/0259351 | A1 | * | 12/2004 | Koizumi et al. | ............ | 438/667 |
| 2005/0003636 | A1 | * | 1/2005 | Takyu et al. | ................. | 438/464 |
| 2005/0124138 | A1 | * | 6/2005 | Aspar et al. | ................. | 438/459 |
| 2005/0277293 | A1 | * | 12/2005 | Kim et al. | .................. | 438/675 |
| 2006/0003551 | A1 | * | 1/2006 | Mancini et al. | ............. | 438/462 |
| 2007/0048994 | A1 | * | 3/2007 | Tuttle | ......................... | 438/597 |

FOREIGN PATENT DOCUMENTS

| JP | 2000-294578 | 10/2000 |
| JP | 2001-127206 | 5/2001 |
| JP | 2004-095952 | 3/2004 |
| JP | 2004-297019 | 10/2004 |
| TW | 577119 A | 11/2002 |
| TW | 2004-079996 | 5/2004 |

* cited by examiner

*Primary Examiner*—Scott B. Geyer
(74) *Attorney, Agent, or Firm*—Harness, Dickey & Pierce, P.L.C.

(57) ABSTRACT

A method of manufacturing a semiconductor device includes: preparing a semiconductor wafer; forming a conductive portion by forming holes in an active surface, forming an insulating film, and embedding a conductive material; forming a first groove; bonding the semiconductor water and a support body via an adhesive layer; thinning the semiconductor wafer by grinding a rear surface while maintaining the insulating film not exposed; forming a second groove; separating each of the semiconductor element sections to make a plurality of semiconductor chips, by isotropic etching so as to expose the insulating film; exposing the conductive portion from the insulating film by etching from the rear surface, to form feedthrough electrodes; and separating the semiconductor element sections into individual pieces by peeling semiconductor chips off from the support body.

6 Claims, 13 Drawing Sheets

METHOD OF MANUFACTURING SEMICONDUCTOR DEVICE

CROSS-REFERENCE TO RELATED APPLICATION

This application claims priority to Japanese Patent Application No. 2004-372795, filed Dec. 24, 2004, the contents of which are incorporated herein by reference.

BACKGROUND

1. Technical Field

The present invention relates to a method of manufacturing a semiconductor device, a semiconductor device, a stacked semiconductor device, a circuit board, and an electronic instrument.

2. Related Art

In recent years, in portable electronic instruments such as portable telephones, notebook type personal computers, and PDAs (Personal Digital Assistants), there have been designs to miniaturize the various kinds of electronic parts such as semiconductor devices, which are provided therein, to satisfy the demands for miniaturization and light weight. Against such a background, a three dimensional mounting technique for semiconductors is proposed. This three dimensional mounting technique is a technique for stacking semiconductor devices having similar functions, or semiconductor devices having different functions.

Furthermore, small size and thin semiconductors are desirable for mounting in three dimensions. Therefore, in Japanese Unexamined Patent Application, First Publication No. 2001-127206, as a method of manufacturing a thin semiconductor device, there is disclosed a method of manufacturing a semiconductor device in which, after forming a plurality of semiconductor devices for example on a semiconductor wafer, and after thinning by back grinding, the semiconductor wafer is cut by dicing to separate the semiconductor devices into individual pieces.

Incidentally, cracks, in what is known as a subsurface damaged layer, are formed in the surface of a semiconductor wafer processed by back grinding. These cracks are prone to be starting points of cracks in the semiconductor wafer, thus they reduce the transverse strength of the semiconductor wafer itself. Moreover, chips and cracks occur on the side wall sections of semiconductor chips formed by cutting the semiconductor wafer by dicing. Therefore, the semiconductor chips can get broken easily, with the chips and cracks being starting points, thus the strength of a semiconductor device itself provided with the semiconductor chips is reduced. Furthermore, the edges of the semiconductor chips cut by dicing are substantially verticalness. In this case, stress concentration occurs at the edges, so that cracks and chips are generated easily on the thin semiconductor chips. Therefore, there is a problem in that the strength of the semiconductor device is reduced.

SUMMARY

An advantage of some aspects of the invention is to provide a method of manufacturing a semiconductor device, a semiconductor device, a stacked semiconductor device, a circuit board, and an electronic instrument, in which the strength of the semiconductor chips, which are separated into individual pieces from a semiconductor wafer, is increased.

A first aspect of the invention provides a method of manufacturing a semiconductor device, including: preparing a semiconductor wafer containing a plurality of semiconductor element sections; forming a conductive portion by forming holes in an active surface of the semiconductor element sections, forming an insulating film in the holes, and embedding a conductive material which protrudes from the active surface via the insulating film; forming a first groove in a cutting area provided on a periphery of an element area of an active surface of the semiconductor wafer so as not to pass through the semiconductor wafer; bonding the semiconductor water and a support body via an adhesive layer; thinning the semiconductor wafer by grinding a rear surface on an opposite side from the active surface, while maintaining the insulating film not exposed; forming a second groove in the rear surface so as not to pass through to the first groove on the opposite side; separating each of the semiconductor element sections to make a plurality of semiconductor chips, by connecting the first groove and the second groove while thinning the semiconductor wafer by isotropic etching from the rear surface of the semiconductor wafer so as to expose the insulating film; exposing the conductive portion from the insulating film by etching from the rear surface, to form feedthrough electrodes in each of the semiconductor element sections; and, separating the semiconductor element sections into individual pieces by peeling the plurality of semiconductor chips off from the support body.

According to the method of manufacturing a semiconductor device of the first aspect of the invention, a thin portion of the semiconductor wafer is formed by forming the first groove and the second groove. By removing the thin portion, the second groove and the first groove are connected while thinning the semiconductor wafer by the isotropic etching. Therefore, the semiconductor chips are separated from the semiconductor element sections of the semiconductor wafer. In the case where the thinning process is performed for example by grinding or polishing, cracks (subsurface damaged layer) formed on the rear surface of the semiconductor wafer are removed. In the case where the second groove is formed for example by dicing, the subsurface damaged layer is formed on the inside walls of the second groove. Thus, by using the isotropic etching, the subsurface damaged layer formed on the inside walls of the second groove is removed, and chips (chipping) occurring at the edges of the rear surface of the semiconductor chips are removed.

At this time, the edges of the rear surfaces of the semiconductor chips are curved by the isotropic etching. Therefore, by curving the edges of the rear surfaces of the semiconductor chips, it is possible to relieve the stress concentration and improve the strength of the semiconductor chips.

It is preferable that, in the method of manufacturing a semiconductor device of the first aspect of the invention, the isotropic etching be spin etching in which an etching liquid is dispensed onto the rear surface of the semiconductor wafer while the semiconductor wafer is being rotated.

By so doing, in the case where wet etching is performed, the etching liquid can be applied to the semiconductor wafer uniformly, and hence it is possible to thin the semiconductor wafer uniformly.

It is preferable that, in the method of manufacturing a semiconductor device of the first aspect of the invention, a width of the second groove be narrower than a width of the first groove.

The second groove is formed on the rear surface of the semiconductor chip, located on the opposite side to the first groove formed on the active surface of the semiconductor chip. Here, in the case when looking through the semiconductor wafer from the vertical direction of the semiconductor wafer, a formation area of the second groove overlaps a formation area of the first groove, and the formation area of the second groove is included inside the formation area of the first groove. Therefore, even in the case where a center location of the second groove and a center location of the first groove are slightly shifted, the formation area of the second groove is included inside the first formation area. It is not necessary to perform a high precision alignment for forming the second groove, thus the forming the second groove is straightforward.

It is preferable that the method of manufacturing a semiconductor device of the first aspect of the invention further include: forming a resin layer by embedding a resin in the first groove after the first groove is formed; extending the second groove to the resin layer, while thinning the semiconductor wafer by the isotropic etching; and cutting the resin layer to make a plurality of semiconductor chips; and peeling the plurality of semiconductor chips off from the support body.

Incidentally, in the case where the first groove is formed by dicing, cracks are formed on the inside walls of the first groove. Therefore, by embedding a resin layer in the first groove, the cracks formed on the inside walls of the first groove are covered with the resin layer. Hereunder, the resin layer prevents the cracks deepening in an inter-semiconductor wafer. The resin layer prevents the transverse strength of the semiconductor chips, which are formed by cutting the resin layer, from being reduced due to the cracks. Since, the resin layer embeds a level difference that has occurred by a difference between a width of the first groove and a width of the second groove on the side wall sections of the semiconductor chips, the resin layer prevents chipping from occurring in the level difference. Hence it is possible to prevent chipping of the semiconductor chips due to the level difference.

It is preferable that, in the method of manufacturing a semiconductor device of the first aspect of the invention, the support body be translucent.

By so doing, for example, in the case where a type of material is used that allows the adhesion of an adhesive layer to which the support body is bonded to be reduced by ultraviolet light, it is possible to easily separate the semiconductor devices into individual pieces by peeling the semiconductor wafer off the support body.

It is preferable that, in the method of manufacturing a semiconductor device of the first aspect of the invention, adhesion in the adhesive layer be reduced by ultraviolet light irradiation.

By so doing, since a translucent support body is used as the support body, the semiconductor wafer can be peeled off from the support body by light irradiation. Thus it is possible to separate the semiconductor devices into individual pieces easily.

A second aspect of the invention provides a semiconductor device including: a semiconductor chip having an active surface and a rear surface on an opposite side of the active surface; an edge formed in a curving-shape on the rear surface; an integrated circuit of the semiconductor chip formed on the active surface; and a feedthrough electrode passing through the semiconductor chip, protruding from the active surface and the rear surface.

According to the semiconductor device of the second aspect of the invention, since the edges of the rear surface of the semiconductor chip are curved, it is possible to relieve the stress concentration at the edges. Thus it is possible to improve the strength of the thinned semiconductor chip.

It is preferable that the semiconductor device of the second aspect of the invention further include: an edge formed in a curving-shape on the active surface of the semiconductor chip; and a resin layer covering the edge.

For example, in the case where dicing is performed from the active surface of the semiconductor chip, chippings and cracks occur on the edge of the active surface. The resin layer covers the edge where the chippings and cracks are formed, reinforcing the semiconductor chip by the resin layer, thus preventing the cracks deepening an inter-semiconductor wafer, and hence making it possible to improve the strength of the semiconductor chip.

A third aspect of the invention provides a stacked semiconductor device including: a plurality of the above-described semiconductor device stacked on top of each other.

According to the stacked semiconductor device of the third aspect invention, since a plurality of the above-described semiconductor devices with high strength is stacked as described above, the stacked semiconductor device including them has high strength and high reliability.

A fourth aspect of the invention provides a circuit board including: the above-described semiconductor device or the above-described stacked semiconductor device.

According to the circuit board of the fourth aspect of the invention, since this is provided with the aforementioned semiconductor devices with high strength, or a stacked semiconductor device with high reliability, the circuit board furnished therewith has high strength and high reliability.

A fifth aspect of the invention provides an electronic instrument including: the aforementioned circuit board.

According to the electronic instrument of the fifth aspect of the invention, since this is provided with the aforementioned circuit board with high strength and high reliability, the electronic instrument furnished therewith has high strength and high reliability.

DESCRIPTION OF EXEMPLARY EMBODIMENTS

Hereunder is a description of a method of manufacturing a semiconductor device, a semiconductor device, a stacked semiconductor device, a circuit board, and an electronic instrument, of the invention.

First is a description of an embodiment of a method of manufacturing a semiconductor device 1 of the invention. In explaining the method of manufacturing the semiconductor device 1, a semiconductor wafer used for manufacturing the semiconductor device 1 will be described.

Figure 1:
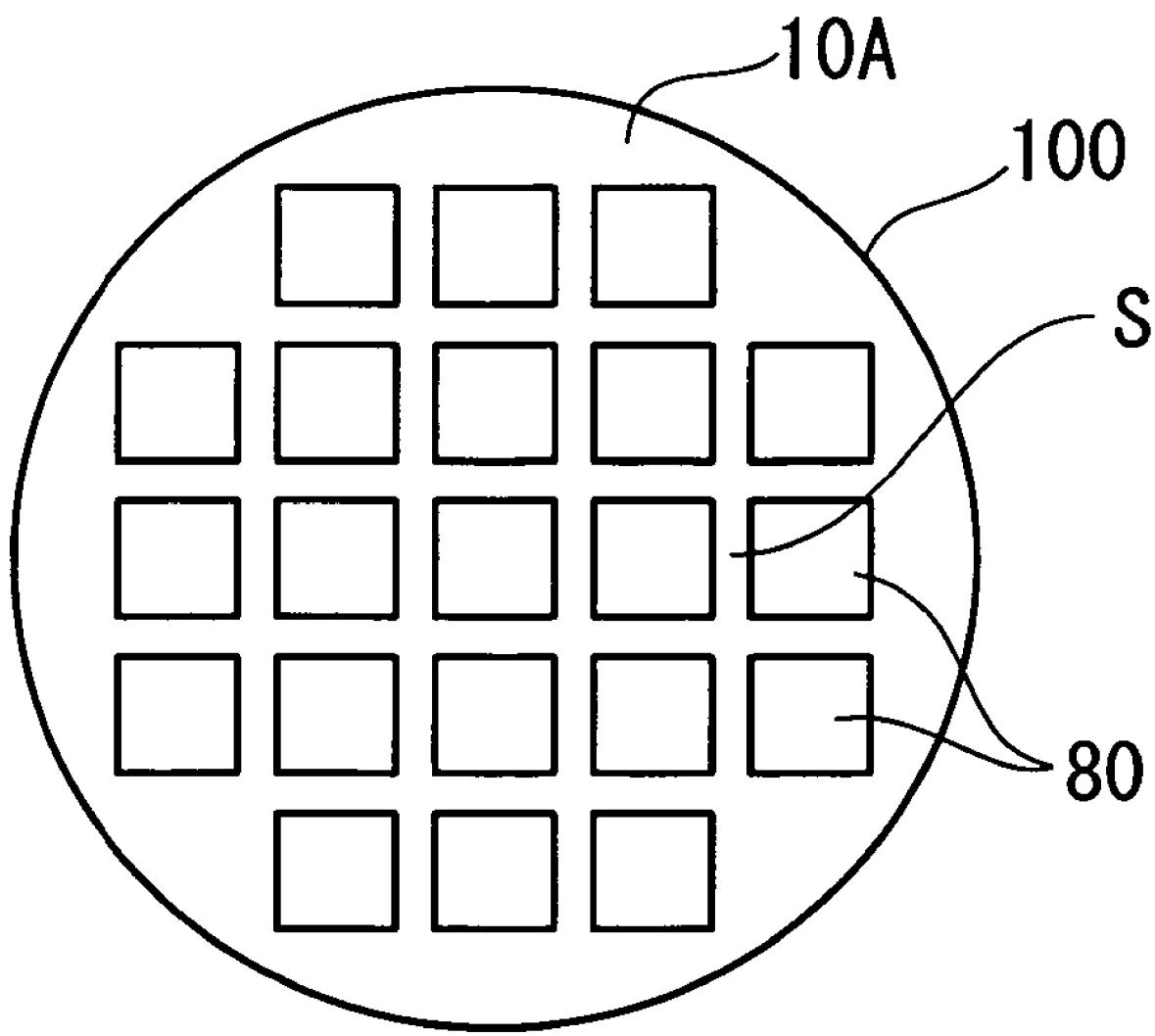
FIG. 1 is a plan view of a semiconductor wafer used for manufacturing a semiconductor device of the invention.

FIG. 1 is a plan view of a silicon wafer (semiconductor wafer) 100 made for example from Si (silicon), which is used for manufacturing the semiconductor device 1 of the invention. A plurality of semiconductor element sections 80 is provided on one surface, being the active surface 10A of the silicon wafer 100. After feedthrough electrodes are formed in the semiconductor element sections 80, and they are cut out in a process to be described, each of the semiconductor element sections 80 becomes a semiconductor chip 10. The semiconductor device 1 includes the semiconductor chip 10.

An electronic circuit including transistors, memory elements, other electronic elements, electrical wiring, electrode pads and the like, is formed on the active surface 10A of each of the semiconductor element sections 80. On the other hand, on a rear surface (refer to FIG. 2), which is the opposite side from the active surface 10A, no electronic circuit as described above is formed. According to this embodiment, the active surface 10A of the silicon wafer 100 denotes the same faces as the active surface 10A of the semiconductor element sections 80 and the active surface 10A of the semiconductor chips 10. The rear surface 10B of the silicon wafer 100 denotes the same faces as the rear surface 10B of the semiconductor element sections 80 and the rear surface 10B of the semiconductor chips 10.

Here, the semiconductor chips 10 are element substrates containing the driving circuits and the like required to construct the semiconductor device 1.

FIG. 2A to FIG. 2E are cross-sectional views each of which describes a manufacturing process for when embedding a conductive portion in a semiconductor chip 10, in the method of manufacturing the semiconductor device 1 of this embodiment.

Moreover FIG. 3 to FIG. 6 are cross-sectional views, in detail, the surface part of the semiconductor chip 10, which is processed in the method of manufacturing the semiconductor device 1 according to this embodiment. In a process of forming feedthrough electrodes as shown in FIG. 2 to FIG. 7, a case will be described in which feedthrough electrodes 12 are formed in the semiconductor element section 80.

Figure 2A:
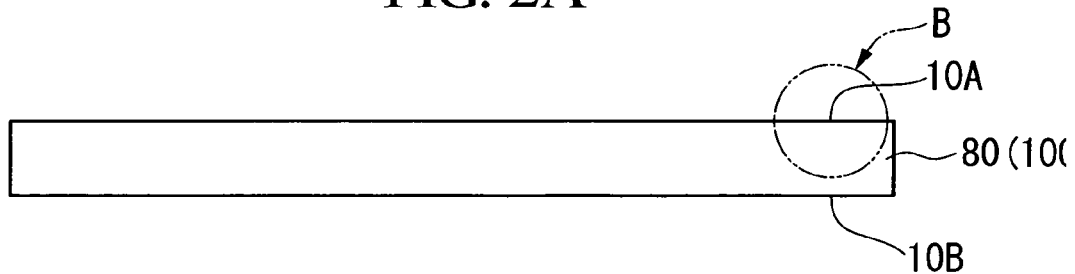
FIGS. 2A to 2E are cross-sectional views each of which describes a manufacturing process for when embedding a conductive portion in a semiconductor chip.
Figure 3A:
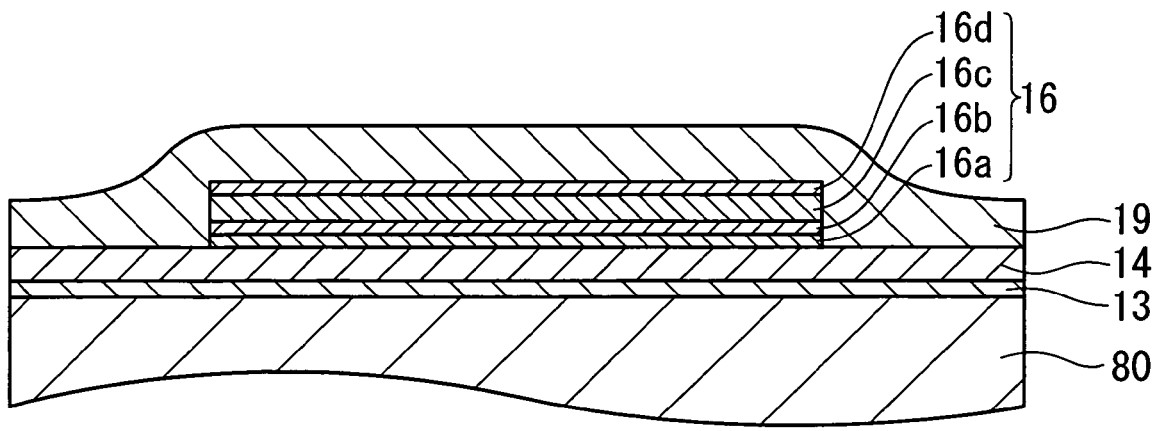
FIGS. 3A to 3C are cross-sectional views each of which describes a manufacturing process for forming the conductive portion.

FIG. 2A is a cross-sectional view of the semiconductor element section 80 as shown in FIG. 1. FIG. 3A is an enlarged view of the part indicated by the letter B in FIG. 2A.

Firstly, as shown in FIG. 3A, an insulating film 13 including $SiO_2$, and an interlayer insulating film 14 including BPSG (Boron doped Phospho-Silicate Glass), are formed in sequence on the semiconductor element section 80 of the silicon wafer 100.

Then, an electrode pad 16 is formed on a part of the interlayer insulating film 14. The electrode pad 16 is formed by stacking in sequence a first layer 16a including Ti (titanium), a second layer 16b including TiN (titanium nitride), a third layer 16c including AlCu (aluminum/copper), and a fourth layer (cap layer) 16d including TiN. Furthermore, the electrode pad 16 is electrically connected to an electronic circuit formed on the active surface 10A of the semiconductor element section 80 at a location that is not shown in the drawing. No electronic circuit is formed underneath the electrode pad 16.

The electrode pad 16 is formed, for example, by forming by sputtering a stacked structure including the first layer 16a, the second layer 16b, the third layer 16c, and the fourth layer 16d over the whole surface of the interlayer insulating film 14, and patterning to a predetermined shape (for example, a circle) using a resist or the like. In this embodiment, the description gives as an example a case in which the electrode pad 16 is formed by the stacked structure. However, the electrode pad 16 may be formed in a single layer structure using only copper, whose electrical resistance is low. Furthermore, the electrode pad 16 is not limited to the structures described above, and it may be changed appropriately according to the required electrical characteristics, physical characteristics, and chemical characteristics.

Moreover, a passivation film 19 is formed on the interlayer insulating film 14, covering a part of the electrode pad 16. It is preferable that the passivation film 19 includes $SiO_2$ (silicon oxide), SiN (silicon nitride), polyimide resin, or the like, or that it is formed by stacking $SiO_2$ on SiN, or vice versa.

Figure 2B:
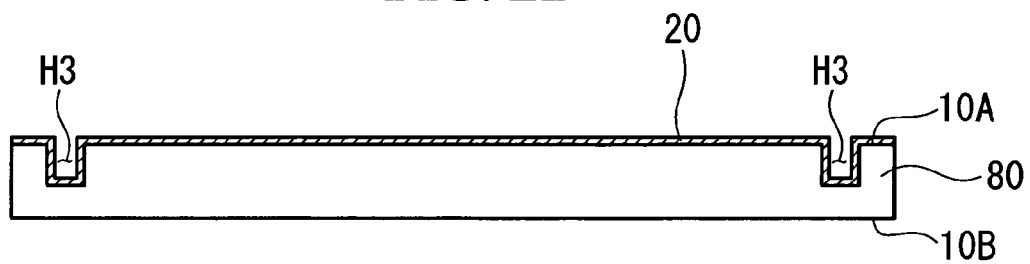

As shown in FIG. 2B, holes H3 are formed in the active surface 10A of the semiconductor element section 80. Here a process for forming the holes H3, is described in detail with reference to FIG. 3 to FIG. 5.

Firstly, resist (not shown in the figure) is coated over the whole surface of the passivation film 19 using a method such as a spin coating method, a dipping method, or a spray coating method.

Figure 3B:
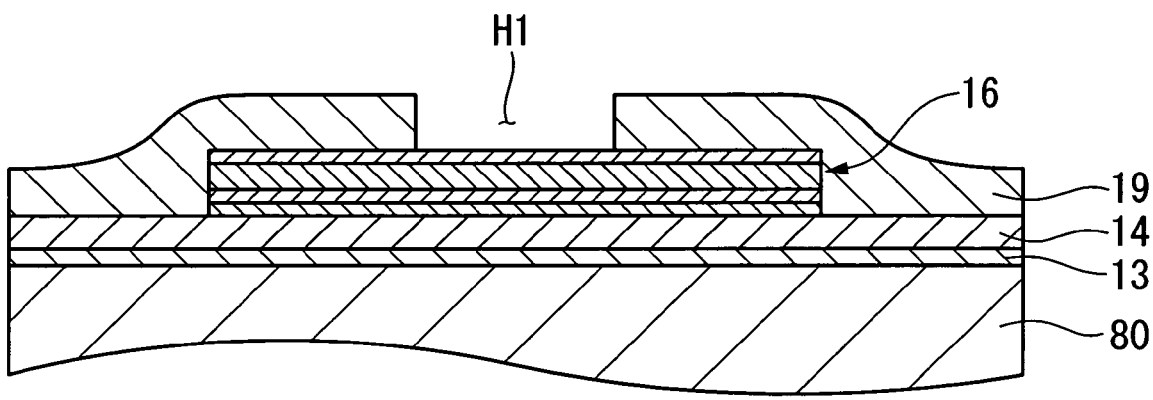

In this manner, after the resist is coated on the passivation film 19, and it is pre-baked, an exposure process and a developing process are performed using a mask in which a predetermined pattern is formed, and the resist is patterned in a predetermined shape. The shape of the resist is set according to the shape of the opening of the electrode pad 16, and the shape of the cross section of the hole formed in the semiconductor element section 80. When the patterning of the resist is completed, after performing a post-bake, part of the passivation film 19, which covers the electrode pad 16 is for example dry etched to form an open section H1 as shown in FIG. 3B. The shape of the cross section of the open section H1 formed in the passivation film is set according to the shape of the opening of the electrode pad 16 formed in a process described later, and the shape of the cross section of a hole formed in the semiconductor element section 80.

Figure 3C:
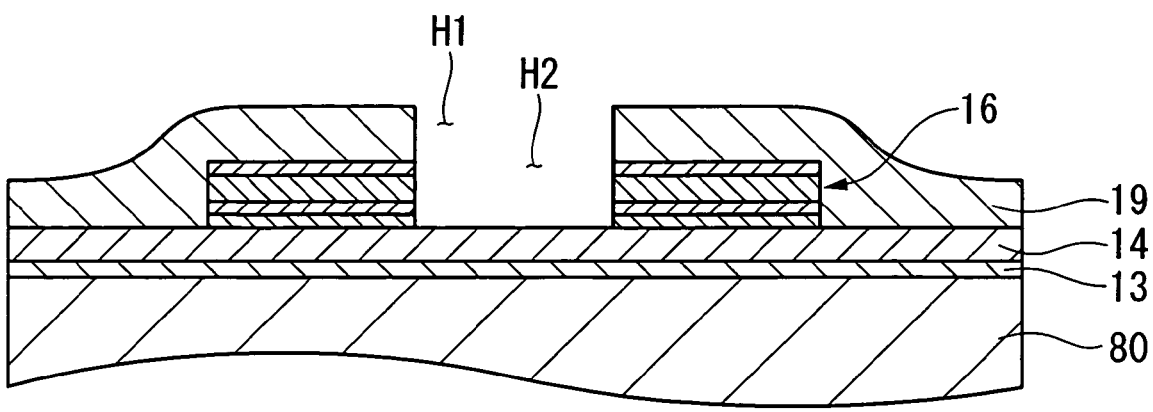

In the next process, the electrode pad 16 is opened by dry etching, using resist on the passivation film 19 formed with the open section H1, as a mask. FIG. 3C is a cross-sectional view showing a state in which an open section H2 is formed by opening the electrode pad 16. In the drawings of FIG. 3A to FIG. 3C, the resist is omitted. As shown in FIG. 3C, the diameter of the open section H1 formed in the passivation film 19, and the open section H2 formed in the electrode pad 16 are identical.

Figure 4A:
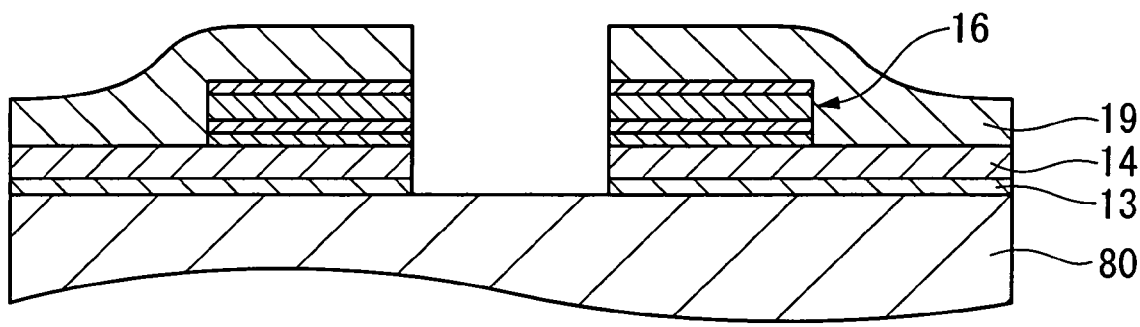
FIGS. 4A and 4B are cross-sectional views each of which describes a manufacturing process for forming the conductive portion subsequent to FIG. 3.

Next, the interlayer insulating film 14 and the insulating film 13 are etched, utilizing the resist used in the previous process as a mask, and the semiconductor element section 80 is exposed as shown in FIG. 4A. FIG. 4A is a cross-sectional view showing a state in which the interlayer insulating film 14 and the insulating film 13 are etched, and part of the semiconductor element section 80 is exposed. After this, the resist formed on the passivation film 19 which is used as an opening mask, is peeled off using a peeling liquid, or by ashing, or the like.

In the previous process, etching is repeated using the same resist. However, it is evidently possible to pattern the resist again after each etching process is completed.

Figure 4B:
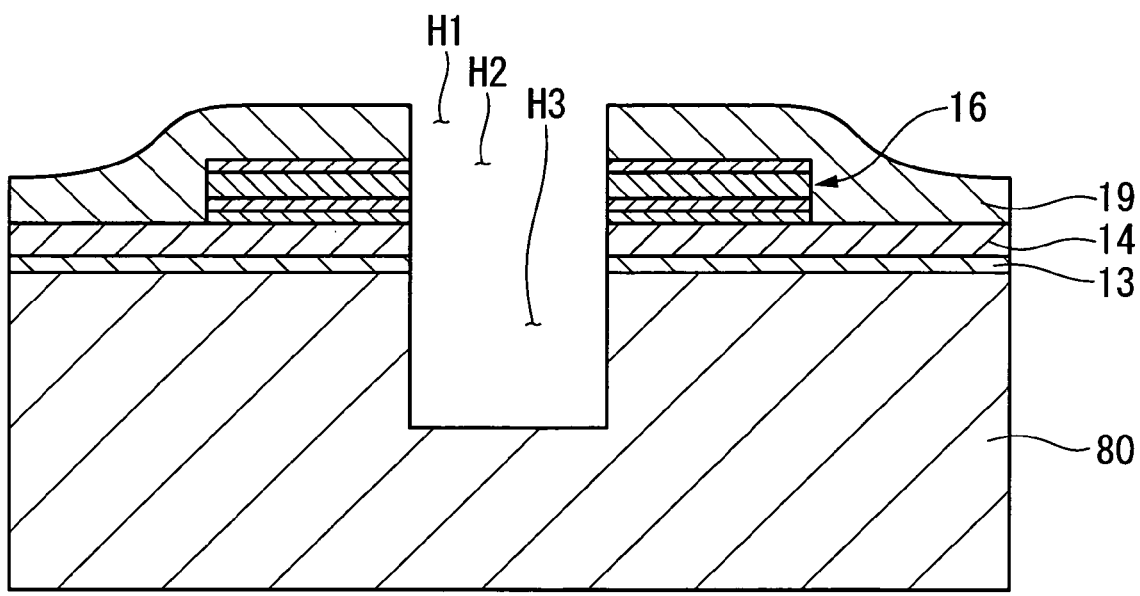

In the next process, the semiconductor element section 80 is perforated by dry etching using the passivation film 19 as a mask as shown in FIG. 4B. Here, it is possible to use ICP (Inductively Coupled Plasma) as an alternative to RIE (Reactive Ion Etching) for dry etching.

As shown in FIG. 4B, since the semiconductor element section 80 is perforated using the passivation film 19 as a mask, the diameter of the hole H3 formed in the semiconductor element section 80 is the same as the open section H1 formed in the passivation film 19. As a result, the diameter of the open section H1 formed in the passivation film 19, the diameter of the open section H2 formed in the electrode pad 16, and the diameter of the hole H3 formed in the semiconductor element section 80, are almost the same. The depth of the hole section H3 is set appropriately according to the thickness of the semiconductor chip to be finally formed.

Figure 5A:
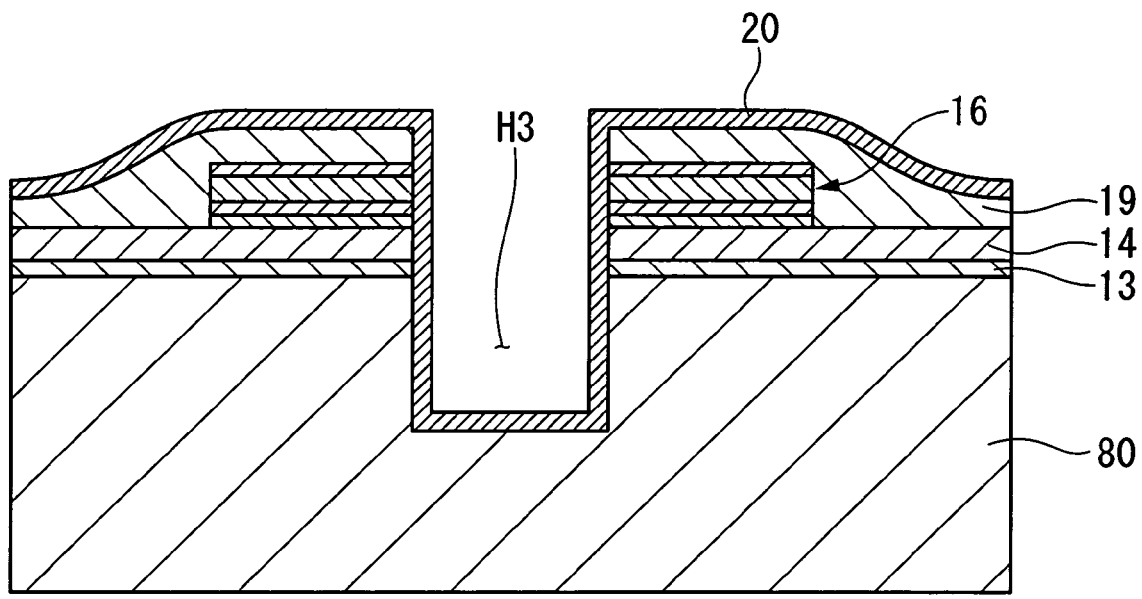
FIGS. 5A and 5B are cross-sectional views each of which describes a manufacturing process for forming the conductive portion subsequent to FIG. 4.

Next, as shown in FIG. 2B, an insulating film 20 is formed on the passivation film 19, and on the inside wall and the bottom face of the hole H3. FIG. 5A is a cross-sectional view showing a state in which the insulating film 20 is formed above the electrode pad 16, and on the inside wall and the bottom face of the hole H3. The insulating film 20 is provided in order to prevent corrosion etc. of the semiconductor element section 80 due to the occurrence of current leakage, and due to oxygen, hydrogen or the like. It is possible to use Tetra Ethyl Ortho Silicate: $Si(OC_2H_5)_4$: referred to hereafter as TEOS, formed using PECVD (Plasma Enhanced Chemical Vapor Deposition), that is PE-TEOS, TEOS formed using ozone CVD, that is $O_3$-TEOS, or silicon oxide formed using CVD.

Subsequently, resist (not shown in the figure) is coated over the whole surface of the passivation film 19 using a method such as a spin coating method, a dipping method, or a spray coating method.

After the resist is coated on the passivation film 19 and it is pre-baked, it is exposed and developed using a mask, patterning the resist, forming an open section of the resist. The open section of the resist is formed on a portion above the electrode pad 16 which is formed surrounding the hole H3. The open section of the resist is formed in, for example, an annular shape with the hole H3 at its center. When the patterning of the resist is completed, after it performs post-baking to the resist. The insulating film 20 and the passivation film 19, which cover part of the electrode pad 16, are removed for example by dry etching, and part of the electrode pad 16 is opened. At this time, a part of the fourth layer 16d of the electrode pad 16 is also removed at the same time.

Figure 5B:
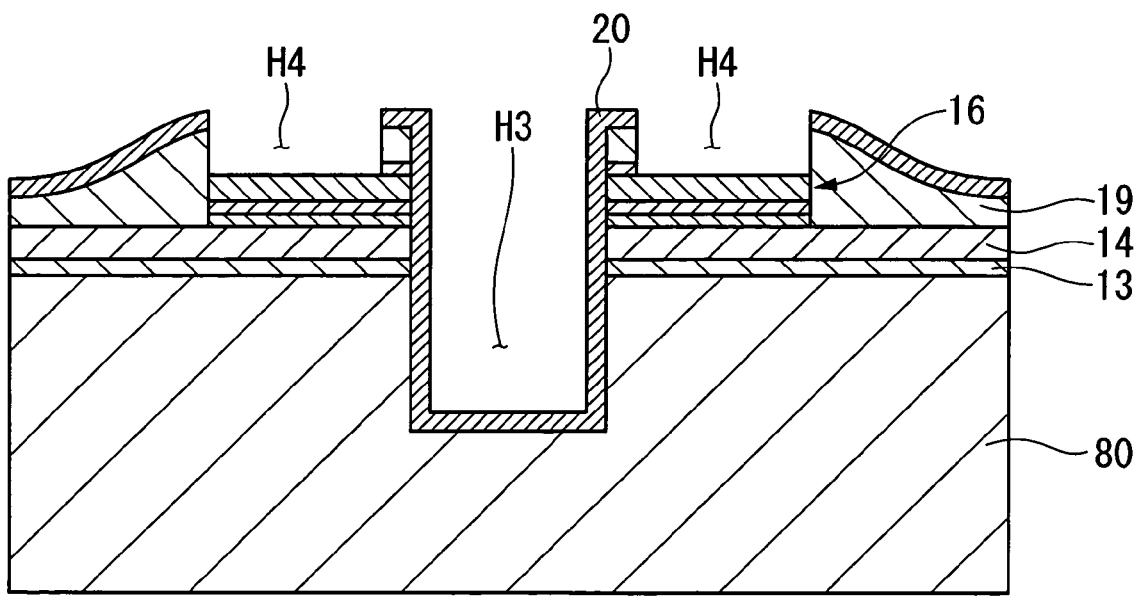

FIG. 5B is a cross-sectional view showing a state in which part of the insulating film 20 and the passivation film 19 which cover the electrode pad 16, are removed. As shown in FIG. 5B, an open section H4 is formed on the area above the electrode pad 16 (area above the third layer 16c). The third layer 16c of the electrode pad 16 is exposed by the open section H4. By means of the open section H4, it is possible to connect a feedthrough electrode (electrode section) 12 formed in a later step, and the electrode pad 16. Accordingly, the open section H4 may be formed in a location other than the location in which the hole H3 is formed. Furthermore, they may be adjacent.

Figure 6A:
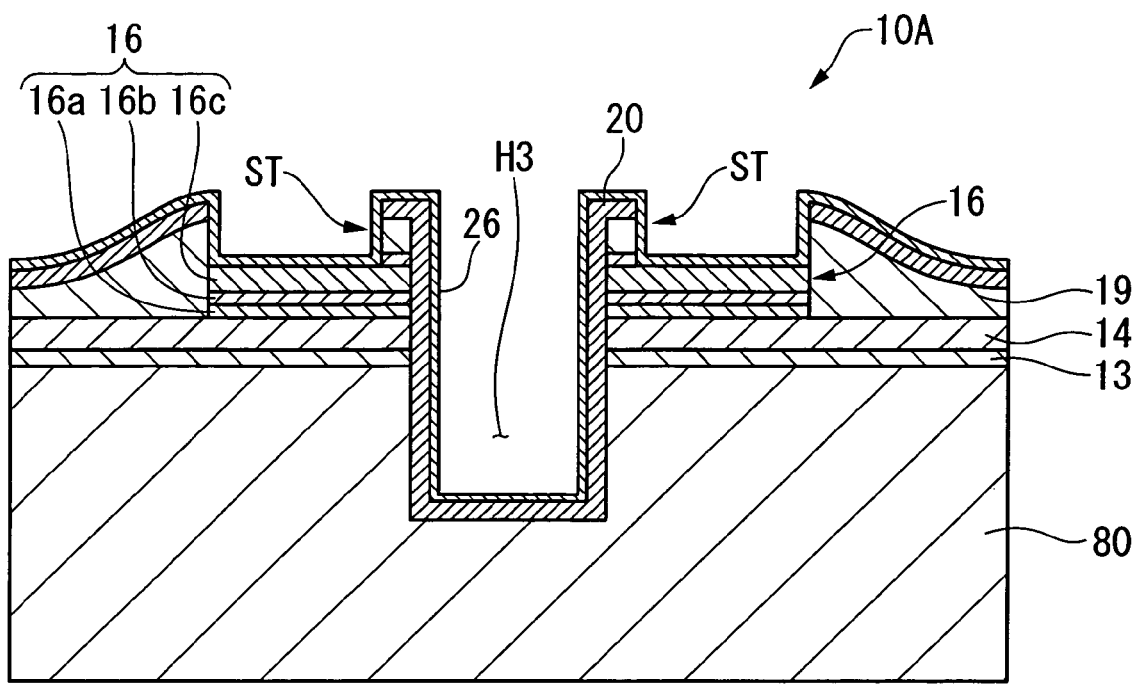
FIGS. 6A and 6B are cross-sectional views each of which describes a manufacturing process for forming the conductive portion subsequent to FIG. 5.

Next, as shown in FIG. 6A, a base film 26 is formed on the active surface 10A of the semiconductor element section 80. Here, the base film 26 is formed over the whole surface of the semiconductor element section 80. Therefore as shown in FIG. 6A, the base film 26 is also formed on the exposed section of the electrode pad 16, and on the inside wall and the bottom of the hole H3. Here, the base film 26 includes a barrier layer and a seed layer. The base film 26 is formed by firstly forming the barrier layer, and afterward forming the seed layer on top of the barrier layer. The barrier layer includes for example TiW, and the seed layer includes Cu. They are formed for example using an IMP (Ion Metal Plasma) method, or a PVD (Physical Vapor Deposition) method such as vacuum deposition, sputtering, or ion plating. The base film 26 sufficiently covers the difference ST in level between the electrode pad 16 and the insulating film 20, and is formed continuously on the electrode pad 16 and the insulating film 20 (including the inside the hole H3). Here, the difference ST means the difference between the height of a top surface of the third layer 16c and the height of a top surface of the insulating film 20.

Figure 2C:
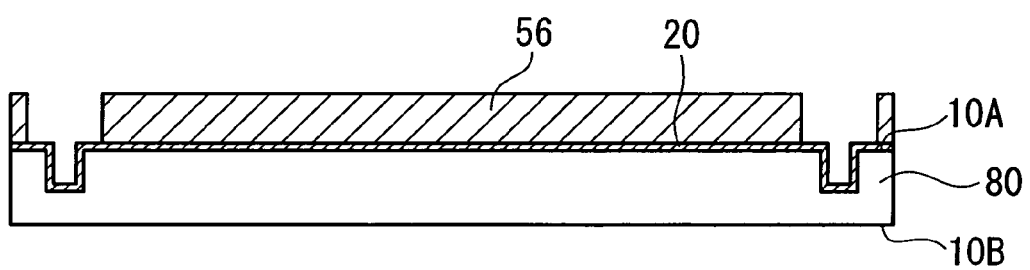
Figure 2D:
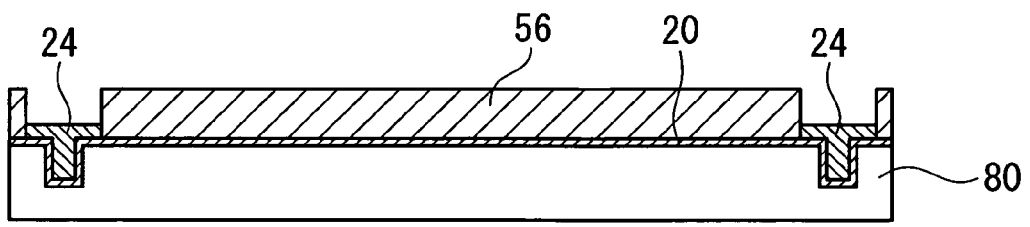
Figure 2E:
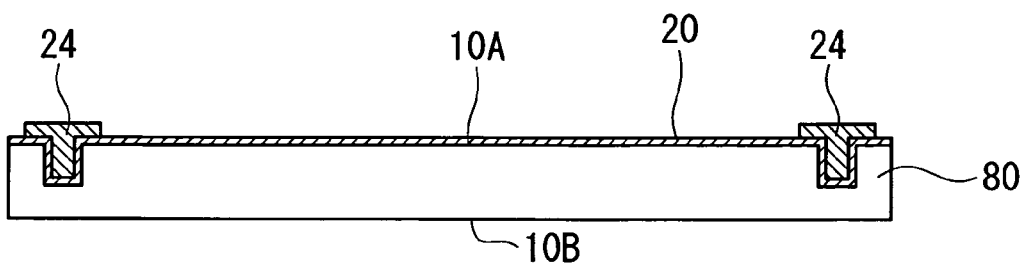

Once the base film 26 has been formed, then as shown in FIG. 2C plating resist is coated over the active surface 10A of the semiconductor element section 80. Afterward, a plating resist pattern 56 is formed which has an open area to form conductive portions 24, by performing patterning of the plating resist. In FIG. 2C to FIG. 2E, the base film 26 is omitted in the drawings. Afterwards, as shown in FIG. 2D, Cu electrolytic plating is performed, so that Cu (copper) is embedded in the holes H3 of the semiconductor element section 80 and the open sections of the plating resist pattern 28, as a conductive material, to thereby form the conductive portions 24.

Figure 6B:
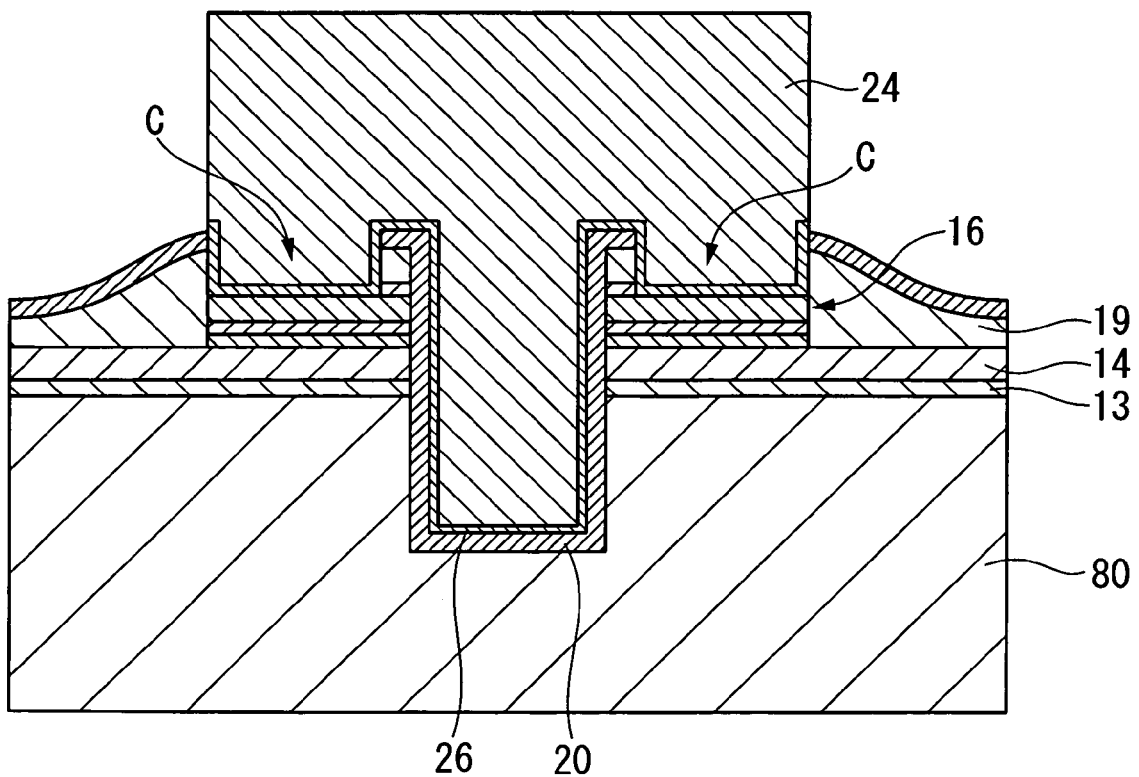

After the conductive portions 24 are formed, then as shown in FIG. 2E the plating resist pattern 56 formed on the semiconductor element section 80 is peeled off. Furthermore, the base film 26 covered with the plating resist pattern 56 is removed. Here, the base film 26 is an electrically conductive film, then in a state shown in FIG. 6A, all the conductive portions 24 formed on the substrate 10 by the base film 26 are conductive. As a result, unnecessary areas of the base film 26 are removed, and each connecting electrode 28 is electrically insulated. The unnecessary areas of the base film 26 are, for example, the exposed areas on the surface. Furthermore, FIG. 6B is a cross-sectional view showing the detail of the structure of the conductive portion 24. The conductive portion 24 is in a protruding shape, which protrudes from the active surface 10A of the semiconductor element section 80, and part of it is shaped such that it is embedded in the semiconductor element section 80.

Moreover, as shown in FIG. 6B, the conductive portion 24 is electrically connected with the electrode pad 16, in the areas indicated by the letter C.

First Groove Forming Process

Figure 7A:
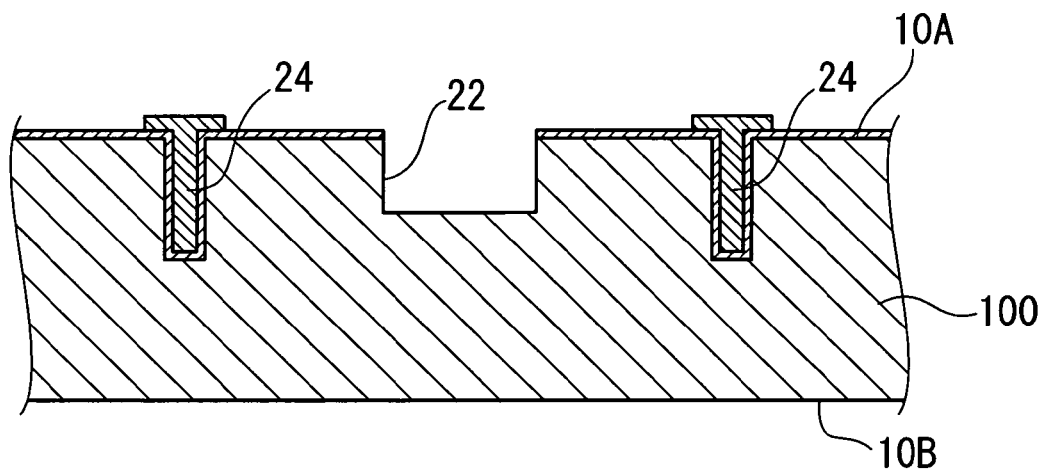
FIGS. 7A to 7C are cross-sectional views each of which describes a manufacturing process for a semiconductor device of a first embodiment.

Next, as shown in FIG. 7A, a first groove 22 is formed using a dicing blade (not shown in the figure) from the rear surface 10B in a cutting area which is provided at the periphery of the element area of the active surface 10A of the silicon wafer 100, such that it does not pass through the silicon wafer. The cutting area is a gap S (refer to FIG. 1) between adjacent semiconductor element sections 80 provided on the silicon wafer 100.

Semiconductor Wafer Thinning Process

Figure 7B:
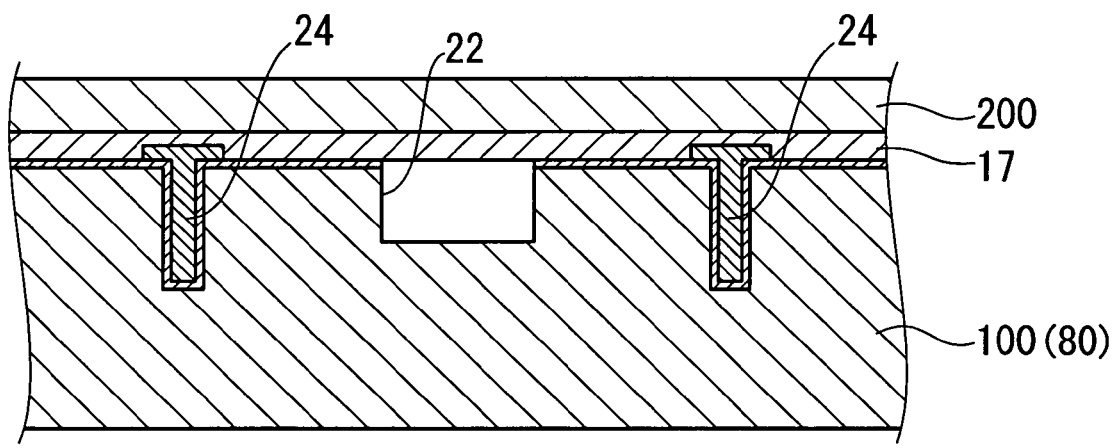
Figure 7C:
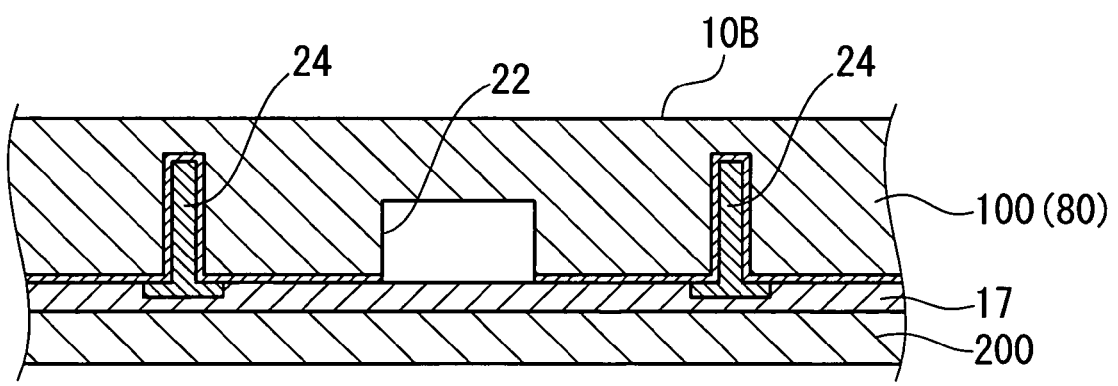

Next, as shown in FIG. 7B, the active surface 10A of the semiconductor chip 10 is bonded to a translucent glass plate (a base) 200 using an ultraviolet light (UV light) reactive type adhesive layer 17. The ultraviolet light reactive type adhesive layer 17 is one where the adhesion is reduced by ultraviolet light irradiation, so that it can be peeled off. By using such an adhesive layer 17, when ultraviolet light is radiated through the translucent glass plate 200, which supports the silicon wafer 100, the adhesive layer 17 reacts to the ultraviolet light, reducing its adhesion. Therefore it is possible to easily peel off the silicon wafer 100 bonded on the glass plate 200.

The glass plate 200 is part of a so called WSS (Wafer Support System), and the semiconductor chip (silicon wafer) 10 is supported by the glass plate 200. A thinning process is performed by back grinding the silicon wafer 100 in a state in which it is bonded to the glass plate 200. For the back grinding, a thinning treatment, such as for example grinding, polishing, or the like, is performed. In order not to damage the conductive portion 24 provided in the semiconductor chip 10 by the back grinding, the thinning process is performed such that the conductive portion 24 is not exposed.

Second Groove Forming Process

Next, a second groove 23 is formed in the rear surface 10B of the semiconductor chip 10 using a dicing blade, similar to forming the first groove 22. The second groove 23 is formed in the rear surface 10B, the opposite side of a portion of which has the first groove 22 of the active surface 10A. An inside wall 23a of the second groove 23 is a part of a side wall face 10C of the semiconductor chip 10 formed by wet etching. At this time, if the widths of the first groove 22 and the second groove 23 are different, when the first groove 22 and the second groove 23 are connected (refer to FIG. 8B), a difference in level occurs in the side wall face 10C of the semiconductor chip 10 to be formed. As a result, chips occur in the semiconductor chip 10 in the area of where the levels are different, and there is concern that the strength of the semiconductor chip 10 will be reduced. Therefore, in this embodiment, the widths of the first groove 22 and the second groove 23 are almost equal. Here, almost equal means that provided the difference in level does not generate chips in the side wall section, the width of the second groove 23 may be smaller than the width of the first groove 22. By so doing, a slight deviation in the location is allowed when forming the second groove 23, so that alignment when forming the second groove 23 can be easier.

At this time cracks occur in what is known as a subsurface damaged layer, in the rear surface 10B of the semiconductor chip 10, which is back ground. The subsurface damaged layer is likely to be a starting point of cracking, and reduces the transverse strength of the semiconductor chip 10. Furthermore, cracks occur similarly on the surface of the second groove 23.

Due to the second groove 23, chips referred to as chipping, caused by the dicing blade, occur at the edges of the rear surface 10B of the semiconductor chip.

The cracks and chips reduce the strength of the semiconductor chip 10. Furthermore, the cracks develop in the semiconductor chip 10, making it easy for the substrate to become cracked, thus reducing the transverse strength of the semiconductor chip 10.

Therefore, in the method of manufacturing the semiconductor device 1 of the invention, in the next process, the silicon wafer 100 is thinned such that the insulating film 13, which covers the conductive portion 24, is exposed, using for example wet etching as isotropic etching from the rear surface 10B of the silicon wafer 100. In this embodiment, for a specific method of the aforementioned wet etching, a spin etching method is used, and an etchant including for example a mixed liquid of hydrofluoric acid and nitric acid, is dispensed onto the rear surface 10B of the semiconductor wafer 10 while the silicon wafer 100 is rotated. Accordingly, it is possible to thin the semiconductor wafer uniformly.

Figure 8A:
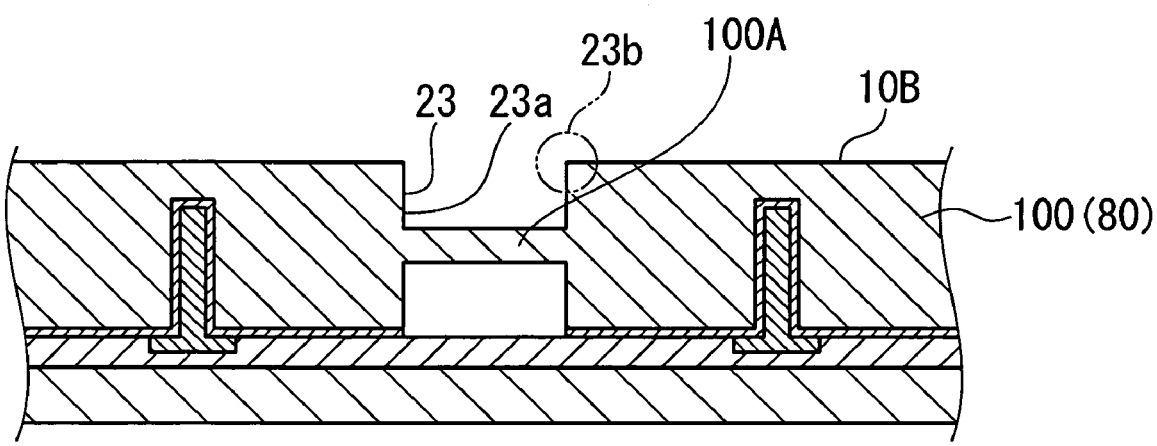
FIGS. 8A to 8C are cross-sectional views each of which describes a manufacturing process for a semiconductor device of the first embodiment.
Figure 8B:
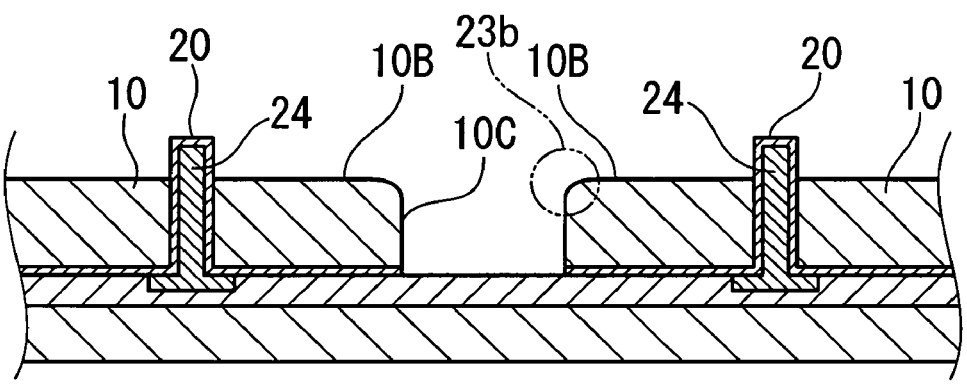

As shown in FIG. 8A, since the first groove 22 and the second groove 23 are formed in the semiconductor wafer 100, a thin portion 100A of the semiconductor wafer 100 is formed. The thickness of the thin portion 100A is sufficiently less than the thickness of the other portion of the semiconductor wafer 100. Therefore, by the wet etching, the thin portion 100A is removed, the second groove 23 and the first groove 22 are connected, and the semiconductor chips 10 are separated from the semiconductor element sections 80 of the semiconductor wafer 100.

At this time, by the wet etching, it is possible to remove the cracks or chips formed on the rear surface 10B of the silicon wafer 100, and on the inside wall 23a of the second groove 23. Furthermore, since the wet etching is isotropic etching, the edges 23b of the rear surface 10B of the semiconductor chip 10 are curved. (refer to FIG. 8B) Therefore, it is possible to prevent stress concentration at the edges of the rear surface 10B of the semiconductor chip 10.

Figure 8C:
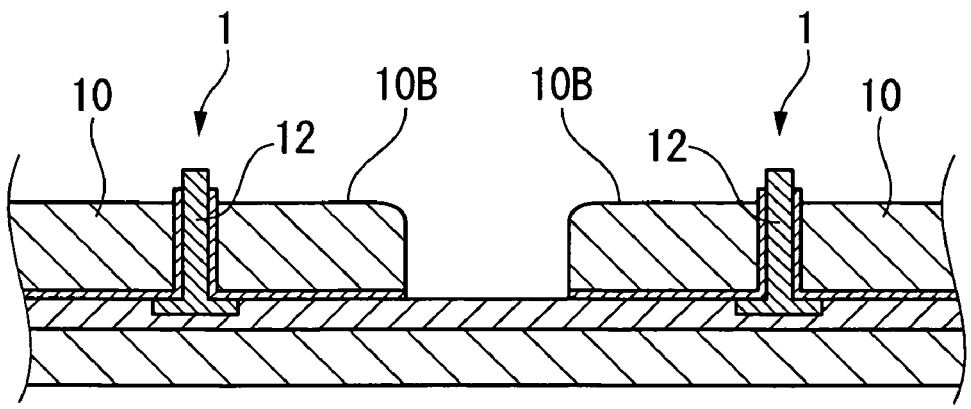

Next, as shown in FIG. 8C, the conductive portions 24 are exposed by removing the insulating film 20 from the rear surface 10B of the silicon wafer 100 by for example dry etching, to form feedthrough electrodes 12.

In such a process, feedthrough electrodes 12 are formed, which protrude from the active surface 10A and the rear surface 10B of the semiconductor chip 10.

Consequently, semiconductor devices 1 are formed on each of the semiconductor chips 10, thereby forming a plurality of semiconductor devices 1 from one silicon wafer 100.

At this time, since the silicon wafer 100 is bonded to the glass plate 200 via the adhesive layer 17 as described previously, each of the semiconductor chips 10 is retained on the glass plate 200.

Therefore, the semiconductor chips 10 must be peeled off from the glass plate 200. Firstly, ultraviolet light is radiated through the glass plate 200. At this time, the adhesive layer 17, which bonds the glass plate 200 and each of the semiconductor chips 10, reacts to the ultraviolet light as described previously, reducing its adhesion. Accordingly, by easily peeling off the semiconductor chips 10 bonded on the glass plate 200, it is possible to obtain a plurality of semiconductor devices 1 (refer to FIG. 9) comprising semiconductor chips 10 that are separated into individual pieces.

According to the method of manufacturing a semiconductor device 1 of the invention, by the wet etching, it is possible to perform removing of the thin portion 100A, thus connecting the second groove 23 and the first groove 22. It is possible to remove the subsurface damaged layer formed on the rear surface 10B of the silicon wafer 100, and on the inside wall 23a of the second groove 23. It is possible to separate the semiconductor element sections 80 on the silicon wafer 100, in which the feedthrough electrodes 12 are formed. Therefore, by peeling the silicon wafer 100 off from the glass plate 200, it is possible to form semiconductor devices 1 that are separated into individual pieces.

Next is a description of a semiconductor device 1 of the invention, which is manufactured according to the above described embodiment.

Figure 9A:
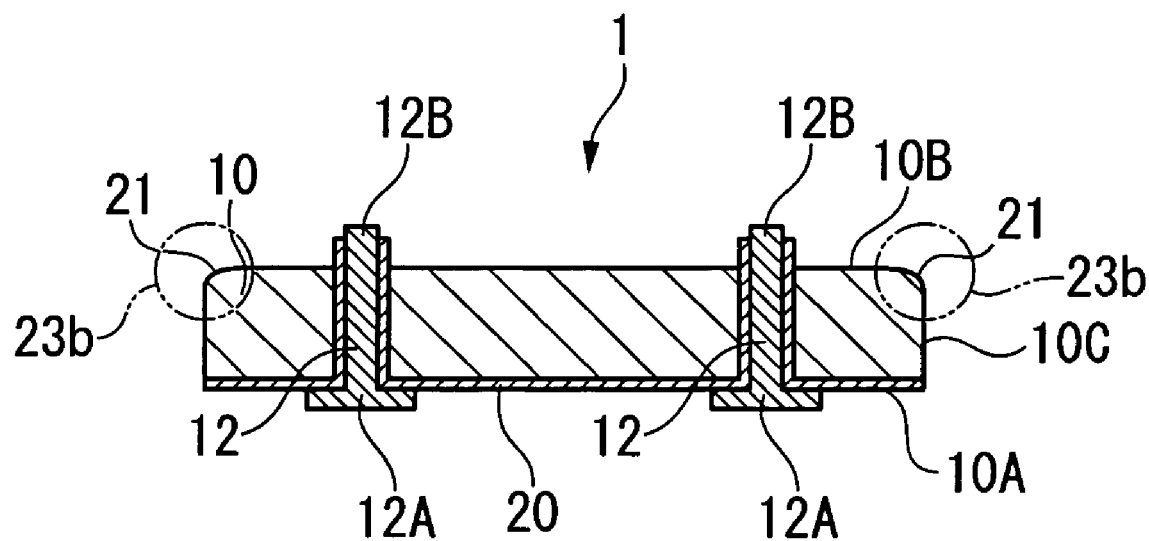
FIG. 9A is a cross-sectional view of the semiconductor device of the first embodiment.
Figure 9B:
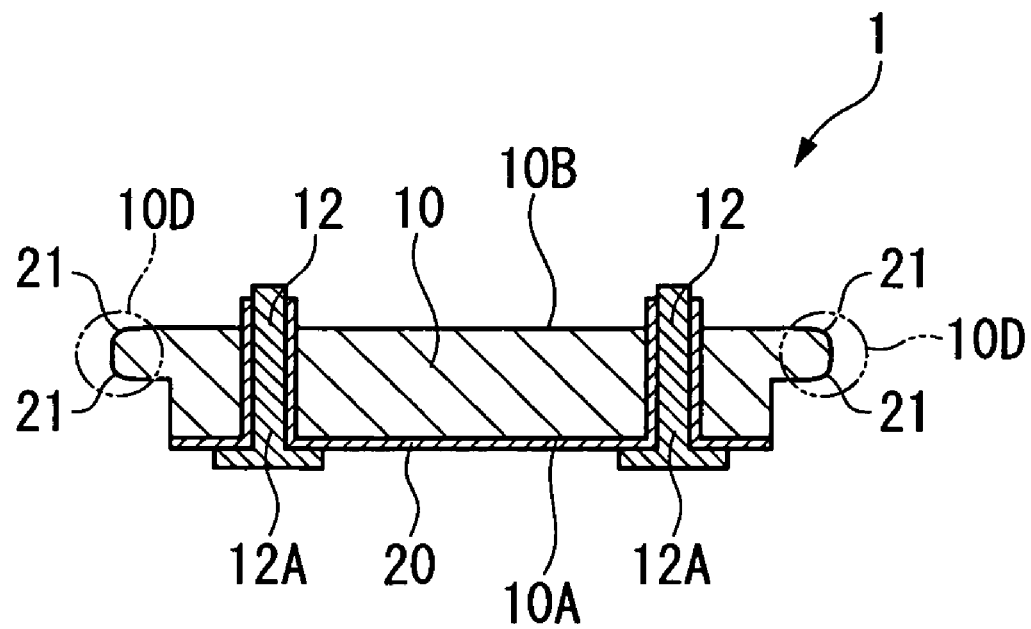
FIG. 9B is a cross-sectional view of a modified example of the semiconductor device.

FIG. 9A and FIG. 9B show sectional side elevations of the semiconductor device 1 according to the above described embodiment.

As shown in FIG. 9A, the semiconductor device 1 is furnished with a rectangular (refer to FIG. 1) semiconductor chip 10, and feedthrough electrodes 12 provided in the semiconductor chip 10. The semiconductor chip 10 is a silicon wafer 100 that has been diced by the above-described method of manufacturing a semiconductor device 1. The feedthrough electrodes 12 pass through the active surface 10A of the semiconductor chip 10, in which an integrated circuit (not shown in the figure) including transistors, memory elements and other electronic elements is formed, and the rear surface 10B on the opposite side from the active surface 10A.

The feedthrough electrodes 12 may be formed, for example, in a state in which they are arranged along the four sides of the semiconductor chip 10 in plan view, or may be formed along two facing sides on the semiconductor chip 10, or only one may be formed on the semiconductor chip 10.

The edges 23b of the rear surface 10B of the semiconductor chip are curved sections 21. Therefore the curved sections 21 relieve stress concentration at the edges 23b of the rear surface 10B of the semiconductor chip 10. As shown in FIG. 9A, the surface of the side wall section 10C of the semiconductor chip 10 is flat. As described previously, provided that chips do not occur, then as shown in FIG. 9B, in the method of manufacturing a semiconductor device 1, there may be a step level difference produced by making the width of the first groove 22 larger than the width of the second groove 23.

At this time, as shown in FIG. 9B, the corners 10D of the semiconductor chip 10 where the levels are different, are rounded by wet etching, which is performed in the aforementioned process of separating the semiconductor device 1 into individual pieces, thus forming curved sections 21. Accordingly, by relieving the stress concentration at the corners 10D of the rear surface 10B of the semiconductor chip 10, it is possible to prevent chipping of the semiconductor chip 10.

In this embodiment, in the feedthrough electrodes 12, a first electrode 12A formed on the active surface 10A is larger than a second electrode 12B formed on the rear surface 10B, and are formed as a circle or a square on a plan view. Furthermore, holes H3 are formed in the semiconductor chip 10 for forming the feedthrough electrodes 12.

An insulating film 20 is provided in the holes H3, and electrically insulates the feedthrough electrodes 12 and the silicon part of the semiconductor chip 10. The feedthrough electrodes 12 are connected to the electrode pads 16, and are electrically connected to the integrated circuit provided on the semiconductor chip 10. Moreover, the semiconductor device 1 is capable of conducting electricity between the active surface 10A and the rear surface 10B of the semiconductor chip 10 via the feedthrough electrodes 12.

According to the semiconductor device of the invention, since the edges 23b of the rear surface 10B of the semiconductor chip 10 are curved, it is possible to relieve the stress concentration at the edges 23b, and hence it is possible to improve the strength of the thinned semiconductor chip 10. Furthermore, since chipping at the edges 23b of the side wall sections 10C of the rear face of the semiconductor chip 10, due to the second grooves 23 can be removed, and the subsurface damaged layer formed in the side wall section 10C can be removed, it is possible to improve the transverse strength of the semiconductor chip 10. As a result, the strength of the semiconductor device 1 itself, which is provided with the semiconductor chip 10, is improved.

Second Embodiment

Next is a description of a second embodiment of a method of manufacturing a semiconductor device of the invention. A method of manufacturing a semiconductor device 2 in this embodiment is a method for, after forming the first groove 22 in the manufacturing process of the first embodiment, embedding a resin layer 25 in the first groove 22, and then separating individual pieces of semiconductor devices 1 from the silicon wafer 100. Accordingly, the processes after the process for forming the resin layer 25 will be described in detail, and the descriptions of the other processes are simplified. Furthermore, in FIG. 10 and FIG. 11 which show intermediate processing during manufacturing the semiconductor devices 1, similarly to the aforementioned embodiment, a process is illustrated in which semiconductor devices 1 are formed in adjacent semiconductor element sections 80 on a silicon wafer 100, and separated into individual pieces.

Firstly, similarly to the first embodiment, holes H3 are formed, which pass feedthrough electrode pads 16 provided on the active surface 10A of semiconductor chips 10 formed from a silicon wafer 100.

Then, an insulating film 20 or the like is formed in the holes H3, and conductive portions 24 formed from copper (Cu) are embedded inside the holes H3. In this manner, conductive portions 24 which protrude above the electrode pads 16 are formed.

After forming the conductive portions 24, a first groove 22, which is open, is formed using a dicing blade (not shown in the drawing) from the active surface 10A of the semiconductor chip 10, such that it does not pass through the silicon wafer 100.

At this time, cracks occur on the surface of an inside wall 22a of the first grooves 22, and chips occur at the edges 22b of the first groove 22 and the active surface 10A of the semiconductor chips 10 due to the dicing blade.

Resin Layer Embedding Process

Figure 10A:
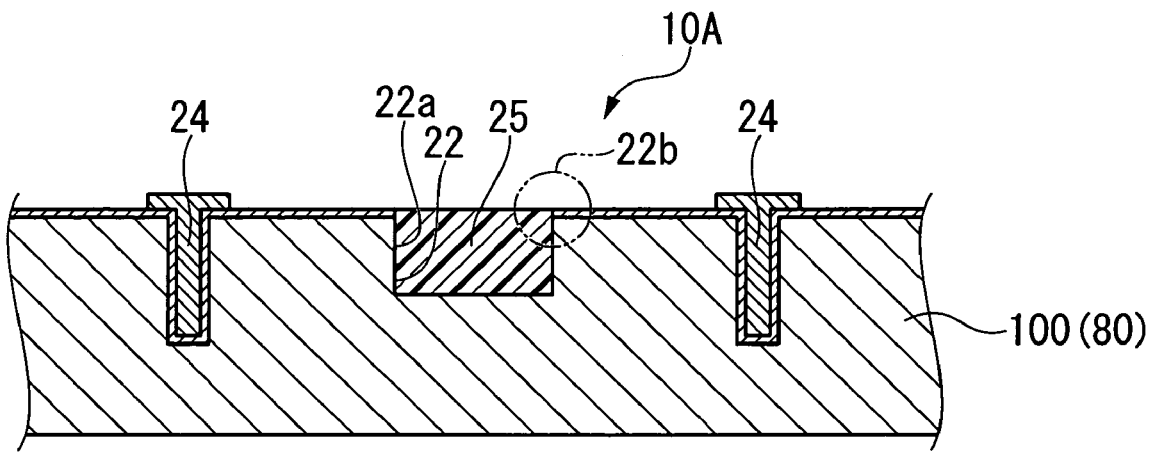
FIGS. 10A to 10C are cross-sectional views each of which describes a manufacturing process for a semiconductor device of a second embodiment.

As described above, in the method of manufacturing a semiconductor device of this embodiment, after forming the first groove 22, the resin layer 25 is formed by embedding resin in the first groove 22 as shown in FIG. 10A. As a resin constituting the resin layer 25, for example epoxy resin or the like is used, which is resistant to the etching liquid (mixed solution of hydrofluoric acid and nitric acid) used when spin etching described later is performed.

In this manner, cracks, which are formed in the surface of the first groove 22, are covered by embedding the resin layer 25 in the first groove 22. Consequently, the resin layer 25 can prevent the development of cracks.

Semiconductor Chip Thinning Process

Figure 10B:
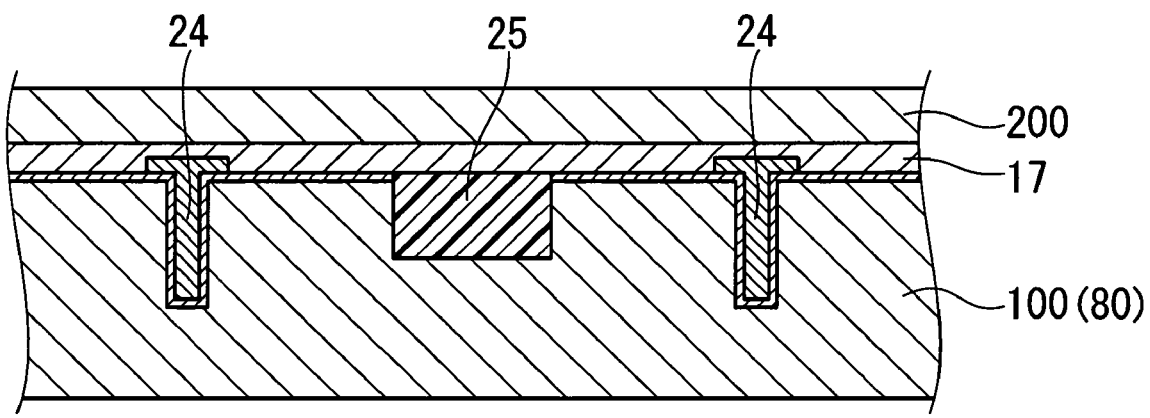

Next, as shown in FIG. 10B, the active surface 10A of the silicon wafer 100 is bonded to a translucent glass plate 200 using an ultraviolet light (UV light) reactive type adhesive layer 17.

Figure 10C:
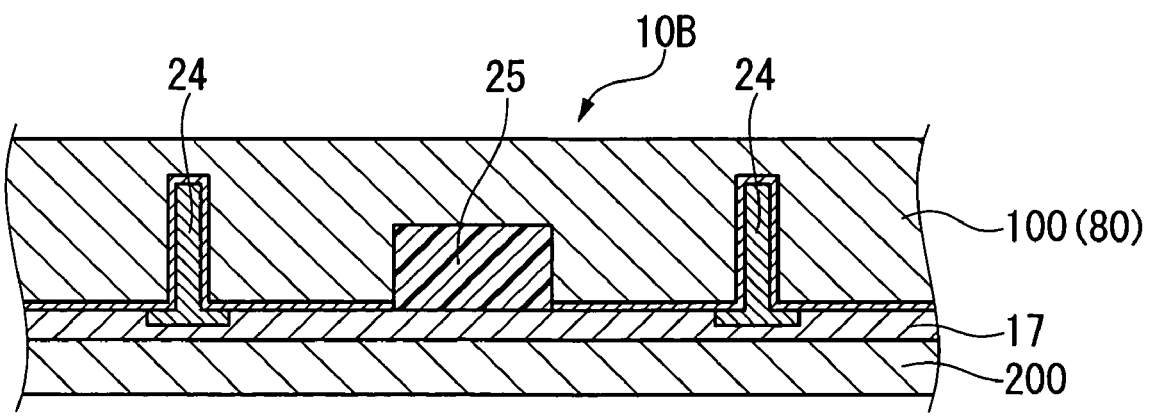

Then, as shown in FIG. 10C, in a state in which the semiconductor chip 10 is bonded to the glass plate 200, a thinning process is performed similarly to the first embodiment by back grinding the silicon wafer 100.

Figure 11A:
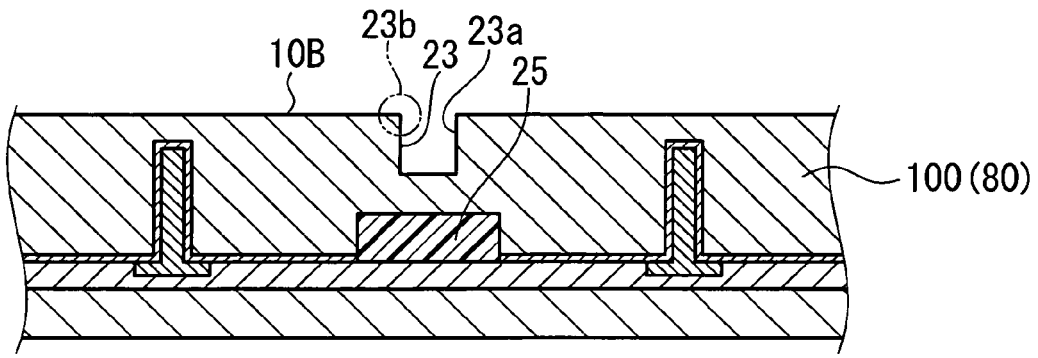
FIGS. 11A to 11D are cross-sectional views each of which describes a manufacturing process for a semiconductor device of the second embodiment.

Next, as shown in FIG. 11A, a second groove 23, which do not reach the resin layer 25, is formed in the rear surface 10B of the silicon wafer 100, directly above the resin layer 25, using a dicing blade.

At this time, it is preferable that the width of the second groove 23 is smaller than the width of the first groove 22. Here, in the case when looking through the semiconductor wafer 100 from the vertical direction of the semiconductor wafer 100, a formation area of the second groove 23 overlaps a formation area of the first groove 22, and the formation area of the second groove 23 is included inside the formation area of the first groove 22. That is, in the case where the second groove 23 is formed in the silicon wafer 100, even if a center location of the second groove and a center location of the first groove are slightly shifted, the formation area of the second groove is included inside the first formation area. It is not necessary to perform a high precision alignment for forming the second groove 23, thus the forming the second groove 23 is straightforward. It is possible to reliably pierce through between the second groove 23 and the first groove 22 by wet etching. That is, positioning on the silicon wafer 100 when forming the second groove 23 is straightforward.

Here, cracks occur on the rear surface 10B of the back ground silicon wafer 100. Furthermore, cracks occur similarly on the inside walls 23a (the side wall sections of the semiconductor chip 10) of the second groove 23, and chips occur at the edges 23b of the second groove 23 and the rear surface 10B of the semiconductor chip 10 due to the dicing blade.

Figure 11B:
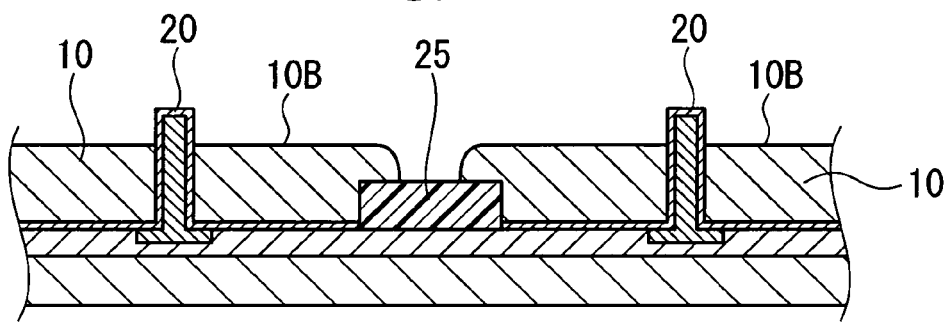

Accordingly, as shown in FIG. 11B, similarly to the aforementioned embodiment, a silicon wafer 100 thinning process is performed as the next process such that the insulating film 13, which covers the conductive portions 24, is exposed from the rear surface 10B of the silicon wafer 100 by wet etching. At this time, by using a spin etching method, it is possible to thin the silicon wafer 100 uniformly.

At this time, since the resin layer 25 is resistant to the etching liquid, the wet etching stops at the resin layer 25. Then, since the wet etching is isotropic, it removes the chips formed on the surface of the inside wall 22a of the first groove 22.

Accordingly, curved sections 21 of the semiconductor chip 10 are formed at the edges 23b of the rear surface 10B of the semiconductor chip 10 by the wet etching. Therefore, the stress concentration at the edges 23b of the rear surface 10B of the semiconductor chip 10 is prevented.

Figure 11C:
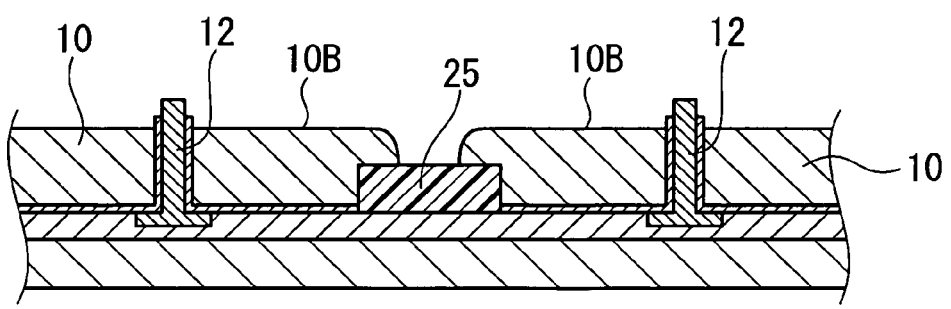
Figure 11D:
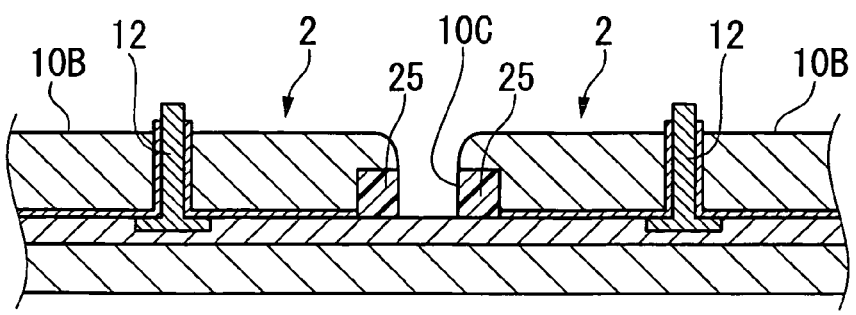

Next, as shown in FIG. 11C, the resin layer 25 is cut by a dicing blade, a laser, or the like. At this time, the side wall sections 10C of the semiconductor device 2 may be formed in a flat shape by cutting the resin layer 25 to a width corresponding to that of the second groove 23.

Next, the semiconductor chips 10 are peeled off from the glass plate 200. Firstly, ultraviolet light is radiated through the glass plate 200. At this time, as described previously the adhesive layer 17, which bonds the glass plate 200 and the semiconductor chips 10, reacts to the ultraviolet light, reducing its adhesion.

Therefore, it is possible to peel off the semiconductor chips 10 bonded on the glass plate 200 easily. In this manner, by peeling the semiconductor chips 10 off from the glass plate 200, the semiconductor devices (refer to FIG. 12), which are provided with feedthrough electrodes 12 on the semiconductor chips 10, can be separated into individual pieces.

According to the method of manufacturing a semiconductor device 2 of this embodiment, in addition to the same effect as in the method of manufacturing a semiconductor device 1 of the first embodiment, even when the location where the second groove is formed is slightly shifted because the width of the second groove 23 is narrower than the width of the first groove 22, it is possible to form the second groove 23 above the first groove. Therefore, the positioning when forming the second groove 23, is straightforward. Furthermore, by embedding the resin layer 25 in the first groove 22 formed by dicing, the cracks formed on the surface of the first groove 22 are covered. Thus, the resin layer 25 can prevent the cracks from developing. As a result, it is possible to prevent the transverse strength of the semiconductor chips 10, which are formed by cutting the resin layer 25, from being reduced due to the cracks. Moreover, it is possible to avoid a difference in level occurring on the side wall sections 10C of the semiconductor chips caused by the difference in width between the first groove 22 and the second groove 23, since they are covered by the resin layer 25, and hence it is possible to prevent chips from occurring on the semiconductor chips 10 due to the difference in level.

Then, by peeling the semiconductor chips 10 off from the glass plate 200, it is possible to obtain semiconductor devices 2 furnished with semiconductor chips 10 whose strength is improved.

Next is a description of a semiconductor device of the invention, which is manufactured according to the second embodiment.

Figure 12:
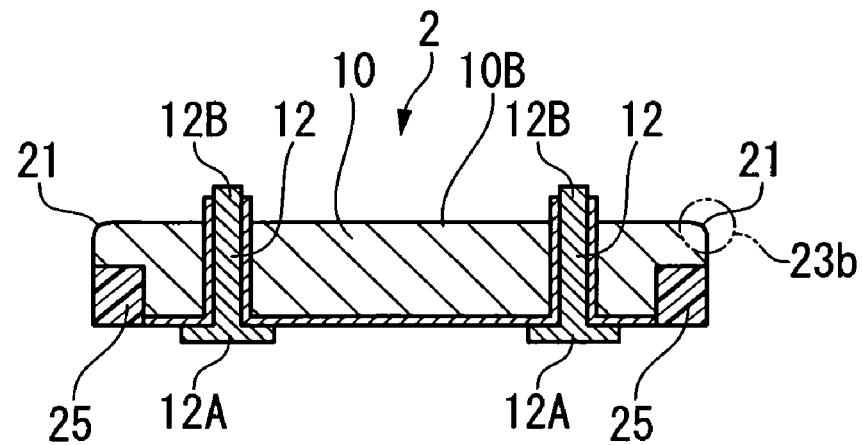
FIG. 12 is a cross-sectional view of the semiconductor device of the second embodiment.

FIG. 12 is a cross-sectional view of a semiconductor device according to this embodiment. Reference 2 in the drawing denotes the semiconductor device. The semiconductor device 2 of this embodiment is described using identical symbols for parts with the same structures as those in the semiconductor device 1 in the above-described embodiments.

As shown in FIG. 12, the semiconductor device 2 includes a rectangular semiconductor chip 10, and feedthrough electrodes 12 which are provided in the semiconductor chip 10.

The edges 23b of the rear surface 10B of the semiconductor chip 10 are curved sections 21 facing outwards. Accordingly, the curved sections 21 can relieve stress concentration at the edges 23b of the rear surface 10B of the semiconductor chip 10. Furthermore, in the semiconductor device 2 of this embodiment, the edges 22b of the active surface 10A are covered by a resin layer 25. The edges 22b denote the surface of the first grooves 22 formed by the aforementioned method of manufacturing a semiconductor device 2.

The other detailed structures are the same as those of the semiconductor device 1 of the first embodiment, and the descriptions are omitted.

In such a structure, the semiconductor device 2 is capable of conducting electricity between the active surface 10A and the rear surface 10B of the semiconductor chip 10 via the though electrodes 12.

According to the semiconductor device 2 of this embodiment, the resin layer 25 covers chips and cracks occurring on the diced surfaces, at the edges 22b of the active surface 10A of the semiconductor chip 10.

Accordingly, by reinforcing the semiconductor chip 10 by the resin layer 25, it is possible to prevent the strength of the semiconductor chip 10 from being reduced due to chips and cracks. As a result, it is possible to improve the transverse strength of the semiconductor chip 10, thus making a semiconductor device 2 with high strength and reliability.

The invention is not limited to the embodiments, and a range of modifications is possible. For example, in this embodiment, a case is described in which, regarding the shape of the feedthrough electrodes 12, there is a large difference between the first electrodes 12A protruding from the active surface 10A, and the second electrodes 12B protruding from the rear surface 10B. However, the invention is applicable to a semiconductor device, and a method of manufacturing a semiconductor device, in which the feedthrough electrodes 12 are the same shape at the active surface 10A and at the rear surface 10B, or in which a range of shapes of feedthrough electrodes is provided.

Next is a description of a stacked semiconductor device 3 in which a plurality of layers of semiconductor devices 1 of the invention is stacked.

Figure 13:
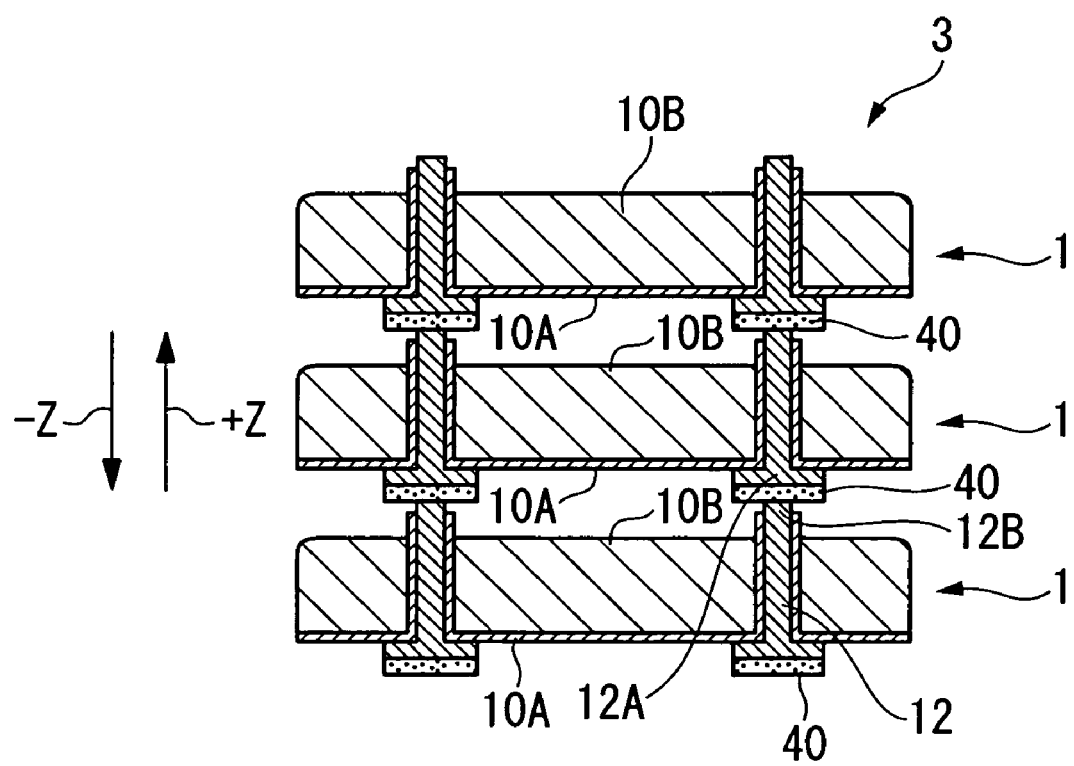
FIG. 13 is a cross-sectional view of an example of a stacked body of the invention.

FIG. 13 is a cross-sectional view of the stacked semiconductor device 3. As shown in FIG. 13, the stacked semiconductor device 3 includes the above-described semiconductor devices 1 stacked with the active surfaces 10A of the semiconductor devices 1 in the bottom direction (refer to −Z direction as shown in FIG. 13). In the stacked semiconductor device 3, the first electrodes 12A protruding from the active surface 10A are connected to the second electrodes 12B protruding from the rear surface 10B, via solder layers 40.

FIG. 13 illustrates a stacked semiconductor device in which a plurality of semiconductor devices 1 of the first embodiment is stacked. However, it is also possible for a plurality of semiconductor devices 2 of the second embodiment to be stacked.

In this manner, for a method of stacking semiconductor devices 1, a possible method is one in which the solder layers 40 are melted for example by using a bonding tool as a heat source, after which they solidify (harden) and are thus mounted.

Furthermore, the arrangement may be such that by using insulating underfill (not shown in the drawing) to fill the gaps between stacked semiconductor devices 1, the strength of the stacked semiconductor device 3 is increased, and the areas other than the areas where the feedthrough electrodes 12 are joined are insulated.

Moreover, the arrangement may also be such that when stacking the semiconductor devices 1, the semiconductor devices 1 are stacked one layer at a time, or the semiconductor devices 1 are stacked together and reflowed, to form a stacked semiconductor device 3.

According to the stacked semiconductor device 3 of the invention, since a plurality of semiconductor devices 1 with high strength is stacked as described above, the stacked semiconductor device 2 furnished with these has high strength, and high reliability itself.

In this embodiment, a plurality of semiconductor devices 1 is stacked. However, the stacked semiconductor device may be, for example, one in which other semiconductor chips (IC chips) or the like are stacked on the semiconductor device 1.

Figure 14:
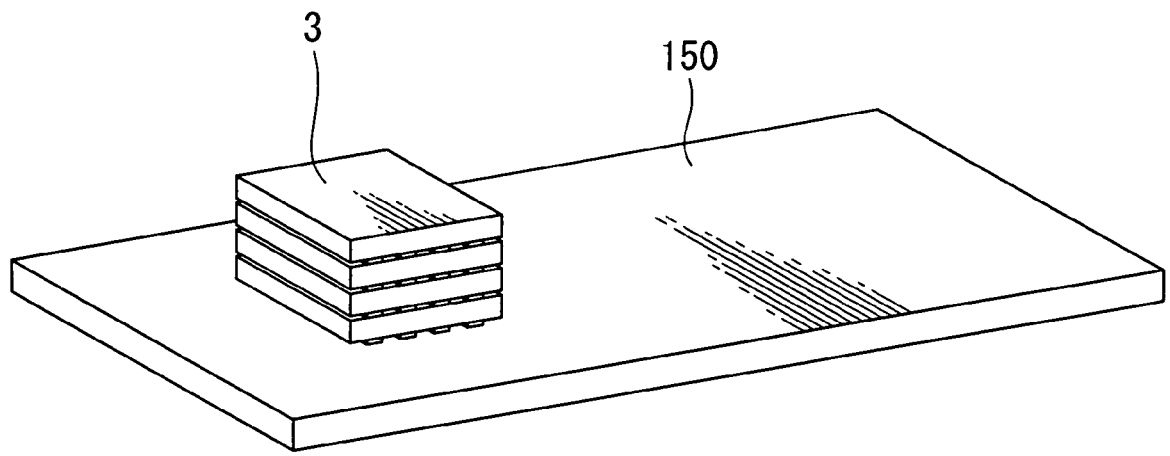
FIG. 14 is a perspective view of an example of a circuit board of the invention.

Next is a description of a circuit board, which is provided with a stacked semiconductor device 3 including semiconductor devices 1 or 2 of the invention. FIG. 14 is a perspective view of a schematic structure of a circuit board according to an embodiment of the invention. As shown in FIG. 14, a stacked semiconductor device 3, in which semiconductor chips or the like are stacked on a semiconductor device 1, is mounted on the circuit board 150 of this embodiment. The circuit board 150 is made of an organic substrate such as a glass epoxy board or the like. A wiring pattern (not shown in the drawing) formed from copper or the like, is formed so as to make a desired circuit, and furthermore, electrode pads (not shown in the drawing) are provided on the wiring pattern.

Moreover, first electrode sections 12A of the semiconductor device 1, being the bottom layer of the stacked semiconductor device 3, are electrically connected to the electrical pads. Thus the stacked semiconductor device 3 is mounted on the circuit board 150. Instead of the stacked semiconductor device 3, just one of the semiconductor devices 1 or 2 may be mounted.

Since the circuit board 150 of the invention is furnished with semiconductor devices 1 with high transverse strength, and a stacked semiconductor device 3 with high reliability as described previously, the circuit board 150 furnished with these has high strength and high reliability itself.

Figure 15:
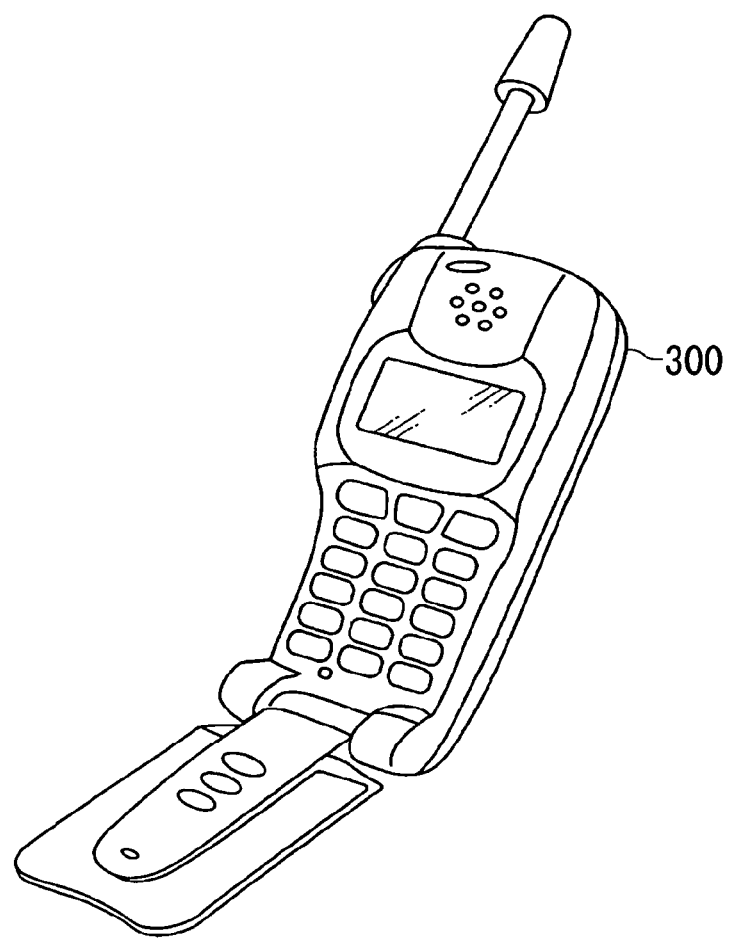
FIG. 15 is a perspective view of an example of an electronic instrument of the invention.

Next is a description of an electronic instrument of the invention furnished with the circuit board 150. FIG. 15 is a perspective view of a portable telephone 300, serving as an electronic instrument illustrating an embodiment of the invention. Here, the circuit board 150 is installed inside the portable telephone 300.

According to the portable telephone 300 of the invention, since this is provided with the circuit board 150 with high reliability as described previously, the portable telephone 300 furnished therewith has high reliability itself.

The electronic instrument is not limited to the portable telephone 300, and the invention can be used for a range of electronic instruments. For example, it is applicable to electronic instruments of devices and the like furnished with; a liquid crystal display projector, a multi media capable personal computer (PC), an engineering workstation (EWS), a pager, a word-processor, a TV set, a viewfinder type or monitor direct-view type video tape recorder, an electronic notebook, an electronic desk calculator, a car navigation system, a POS terminal, or a touch panel.

While preferred embodiments of the invention have been described and illustrated above, it should be understood that these are exemplary of the invention and are not to be considered as limiting. Additions, omissions, substitutions, and other modifications can be made without departing from the spirit or scope of the invention. Accordingly, the invention is not to be considered as being limited by the foregoing description, and is only limited by the scope of the appended claims.

What is claimed is:

1. A method of manufacturing a semiconductor device comprising:
preparing a semiconductor wafer containing a plurality of semiconductor element sections;
forming a conductive portion by forming holes in an active surface of the semiconductor element sections, forming an insulating film in the holes, and embedding a conductive material which protrudes from the active surface via the insulating film;
forming a first groove in a cutting area provided on a periphery of an element area of an active surface of the semiconductor wafer so as not to pass through the semiconductor wafer;
bonding the semiconductor water and a support body via an adhesive layer;

thinning the semiconductor wafer by grinding a rear surface on an opposite side from the active surface, while maintaining the insulating film not exposed;

forming a second groove in the rear surface so as not to pass through to the first groove on the opposite side;

separating each of the semiconductor element sections to make a plurality of semiconductor chips, by connecting the first groove and the second groove while thinning the semiconductor wafer by isotropic etching from the rear surface of the semiconductor wafer so as to expose the insulating film;

exposing the conductive portion from the insulating film by etching from the rear surface, to form feedthrough electrodes in each of the semiconductor element sections; and, separating the semiconductor element sections into individual pieces by peeling the plurality of semiconductor chips off from the support body.

2. A method of manufacturing a semiconductor device according to claim 1, wherein the isotropic etching is spin etching in which an etching liquid is dispensed onto the rear surface of the semiconductor wafer while the semiconductor wafer is being rotated.

3. A method of manufacturing a semiconductor device according to claim 1, wherein a width of the second groove is narrower than a width of the first groove.

4. A method of manufacturing a semiconductor device according to claim 3, further comprising:

forming a resin layer by embedding a resin in the first groove after the first groove is formed;

extending the second groove to the resin layer, while thinning the semiconductor wafer by the isotropic etching; and cutting the resin layer to make a plurality of semiconductor chips; and peeling the plurality of semiconductor chips off from the support body.

5. A method of manufacturing a semiconductor device according to claim 1, wherein, the support body is translucent.

6. A method of manufacturing a semiconductor device according to claim 5, wherein, adhesion in the adhesive layer is reduced by ultraviolet light irradiation.

* * * * *